United States Patent
FrantzDale et al.

(10) Patent No.: US 11,161,296 B2
(45) Date of Patent: Nov. 2, 2021

(54) TECHNIQUES FOR REDUCING DIFFERENTIAL CURE ARTIFACTS FOR ADDITIVE FABRICATION AND RELATED SYSTEMS AND METHODS

(71) Applicant: Formlabs, Inc., Somerville, MA (US)

(72) Inventors: Benjamin FrantzDale, Harvard, MA (US); Andrey Mishchenko, Ann Arbor, MI (US)

(73) Assignee: Formlabs, Inc., Somerville, MA (US)

( * ) Notice: Subject to any disclaimer, the term of this patent is extended or adjusted under 35 U.S.C. 154(b) by 186 days.

(21) Appl. No.: 15/715,325

(22) Filed: Sep. 26, 2017

(65) Prior Publication Data
US 2018/0085994 A1 Mar. 29, 2018

Related U.S. Application Data

(60) Provisional application No. 62/399,569, filed on Sep. 26, 2016.

(51) Int. Cl.
*B29C 64/135* (2017.01)
*G03F 7/20* (2006.01)
(Continued)

(52) U.S. Cl.
CPC .......... *B29C 64/135* (2017.08); *B29C 64/264* (2017.08); *B29C 64/393* (2017.08);
(Continued)

(58) Field of Classification Search
CPC ... B29C 64/135; B29C 64/264; B29C 64/393; G03F 7/0037; G03F 7/2012; G03F 7/26; B33Y 10/00; B33Y 30/00; B33Y 50/00
See application file for complete search history.

(56) References Cited

U.S. PATENT DOCUMENTS

| 5,015,424 A | 5/1991 | Smalley |
| 5,135,379 A | 8/1992 | Fudim |

(Continued)

FOREIGN PATENT DOCUMENTS

| CN | 104136200 A | 11/2014 |
| CN | 104608378 A | 5/2015 |
| EP | 0609772 A1 | 8/1994 |

OTHER PUBLICATIONS

International Search Report and Written Opinion for International Application No. PCT/US2017/53376 dated Dec. 11, 2017.
(Continued)

*Primary Examiner* — Jacob T Minskey
*Assistant Examiner* — Elisa H Vera
(74) *Attorney, Agent, or Firm* — Wolf, Greenfield & Sacks, P.C.

(57) ABSTRACT

According to some aspects, techniques for reducing time-dependent fabrication artifacts in additive fabrication are provided. By selectively activating and deactivating an element of an additive fabrication device that forms solid material, adjacent regions of material may be formed sequentially, thereby reducing time-dependent fabrication artifacts at the cost of increasing the time taken to fabricate an object. In some embodiments, selective activation and deactivation of an element of an additive fabrication device that forms solid material may be performed to a subset of an object being fabricated based on an assessment of which portions of an object will be visible upon fabrication.

11 Claims, 10 Drawing Sheets

(51) Int. Cl.
*G03F 7/00* (2006.01)
*B29C 64/264* (2017.01)
*B29C 64/393* (2017.01)
*G03F 7/26* (2006.01)
*B33Y 50/00* (2015.01)
*B33Y 30/00* (2015.01)
*B33Y 10/00* (2015.01)

(52) U.S. Cl.
CPC .......... *G03F 7/0037* (2013.01); *G03F 7/2012* (2013.01); *G03F 7/26* (2013.01); *B33Y 10/00* (2014.12); *B33Y 30/00* (2014.12); *B33Y 50/00* (2014.12)

(56) References Cited

U.S. PATENT DOCUMENTS

| | | | |
|---|---|---|---|
| 5,609,814 A | 3/1997 | Takano | |
| 5,965,079 A * | 10/1999 | Manners | B29C 64/135 264/401 |
| 7,833,000 B2 | 11/2010 | Kihara et al. | |
| 2008/0021586 A1 | 1/2008 | Schillen et al. | |
| 2011/0107967 A1 | 5/2011 | Hopkinson et al. | |
| 2012/0046125 A1 | 2/2012 | Sullivan et al. | |
| 2015/0130114 A1 | 5/2015 | Joyce | |
| 2015/0145177 A1 | 5/2015 | El-Siblani et al. | |
| 2015/0183168 A1 | 7/2015 | Liverman et al. | |
| 2016/0067922 A1 | 3/2016 | Voris et al. | |
| 2016/0082666 A1 | 3/2016 | De Pena et al. | |
| 2016/0297141 A1 * | 10/2016 | El-Siblani | B33Y 30/00 |
| 2018/0015664 A1 * | 1/2018 | Kabalnov | B29C 64/165 |

OTHER PUBLICATIONS

Extended European Search Report in connection with European Application No. 17854108.2 dated Apr. 1, 2020.

* cited by examiner

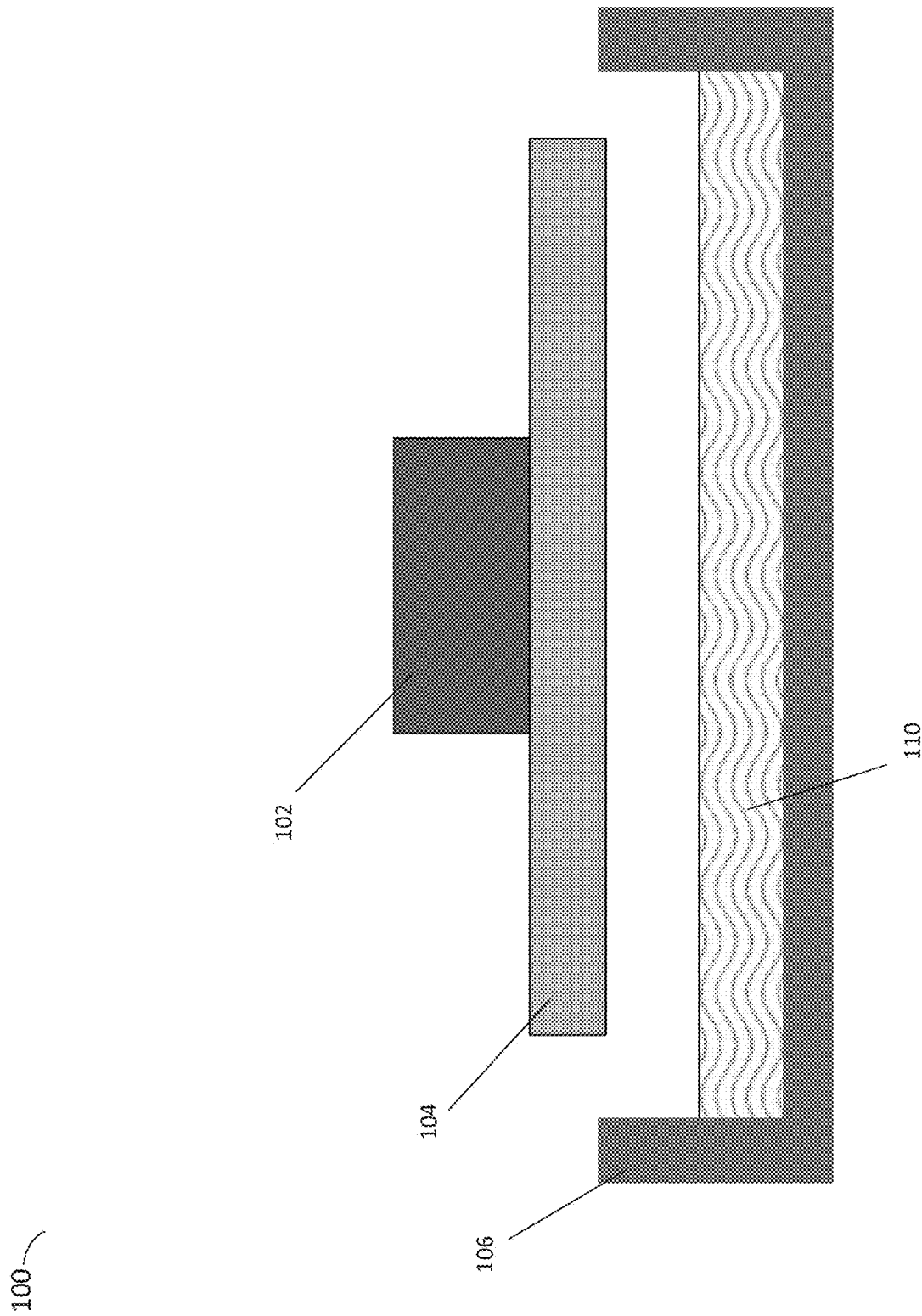

TECHNIQUES FOR REDUCING DIFFERENTIAL CURE ARTIFACTS FOR ADDITIVE FABRICATION AND RELATED SYSTEMS AND METHODS

CROSS-REFERENCE TO RELATED APPLICATIONS

The present application claims the benefit under 35 U.S.C. § 119(e) of U.S. Provisional Patent Application No. 62/399,569, filed Sep. 26, 2016, titled "Techniques For Reducing Differential Cure Artifacts For Additive Fabrication And Related Systems And Methods," which is hereby incorporated by reference in its entirety.

FIELD OF INVENTION

The present application relates generally to techniques for improving the surface finish and reducing differential cure artifacts in an object produced by additive fabrication (e.g., 3d printing).

BACKGROUND

Additive fabrication, e.g., 3-dimensional (3D) printing, provides techniques for fabricating objects, typically by causing portions of a building material to solidify at specific locations. Additive fabrication techniques may include stereolithography, selective or fused deposition modeling, direct composite manufacturing, laminated object manufacturing, selective phase area deposition, multi-phase jet solidification, ballistic particle manufacturing, particle deposition, laser sintering or combinations thereof. Many additive fabrication techniques build objects by forming successive layers, which are typically cross-sections of the desired object. Typically each layer is formed such that it adheres to either a previously formed layer or a substrate upon which the object is built.

In one approach to additive fabrication, known as stereolithography, solid objects are created by successively forming thin layers of a curable polymer resin, typically first onto a substrate and then one on top of another. Exposure to actinic radiation cures a thin layer of liquid resin, which causes it to harden, change physical properties, and adhere to previously cured layers or the bottom surface of the build platform. In such techniques as stereolithography, the object is formed by moving an area of incident actinic radiation across the layer of liquid resin to complete the cross section of the object being formed. An area of incident actinic radiation could be caused by any light source(s), such as by a laser.

SUMMARY

According to some aspects, a method of configuring an additive fabrication device to fabricate an object is provided, the additive fabrication device configured to form solid material by directing at least one source of actinic radiation onto a liquid photopolymer, the method comprising identifying, based on a three-dimensional model of the object, at least a first region of the object expected to be visible upon fabrication of the object by the additive fabrication device, generating, based on the three-dimensional model of the object for at least one cross-section of the object that intersects the first region, a path over which the at least one source of actinic radiation is to be directed to form the at least one cross-section of the object, wherein the path includes a first portion over which the at least one source of actinic radiation is to be activated, and a second portion over which the at least one source of actinic radiation is to be deactivated, wherein the second portion of the path is generated based on the identified first region of the object, and generating, using at least one processor, instructions that, when executed by the additive fabrication device, cause the additive fabrication device to fabricate the object at least in part by directing the least one source of actinic radiation over the generated path and activating and deactivating the at least one source of actinic radiation over the generated path according to the first portion and second portion of the path.

According to some aspects, a computer system is provided comprising at least one processor, at least one computer readable medium comprising processor-executable instructions that, when executed, cause the at least one processor to perform a method of configuring an additive fabrication device to fabricate an object, the additive fabrication device configured to form solid material by directing at least one source of actinic radiation onto a liquid photopolymer, the method comprising identifying, based on a three-dimensional model of the object, at least a first region of the object expected to be visible upon fabrication of the object by the additive fabrication device, generating, based on the three-dimensional model of the object for at least one cross-section of the object that intersects the first region, a path over which the at least one source of actinic radiation is to be directed to form the at least one cross-section of the object, wherein the path includes a first portion over which the at least one source of actinic radiation is to be activated, and a second portion over which the at least one source of actinic radiation is to be deactivated, wherein the second portion of the path is generated based on the identified first region of the object, and generating, using the at least one processor, instructions that, when executed by the additive fabrication device, cause the additive fabrication device to fabricate the object at least in part by directing the least one source of actinic radiation over the generated path and activating and deactivating the at least one source of actinic radiation over the generated path according to the first portion and second portion of the path.

The foregoing summary is provided by way of illustration and is not intended to be limiting.

BRIEF DESCRIPTION OF DRAWINGS

The accompanying drawings are not intended to be drawn to scale. For purposes of clarity not every component may be labeled in every drawing. In the drawings:

FIGS. 1A-1B illustrate a schematic view of a stereolithographic printer that forms a plurality of layers of a part, according to some embodiments;

DETAILED DESCRIPTION

Figure 1B:
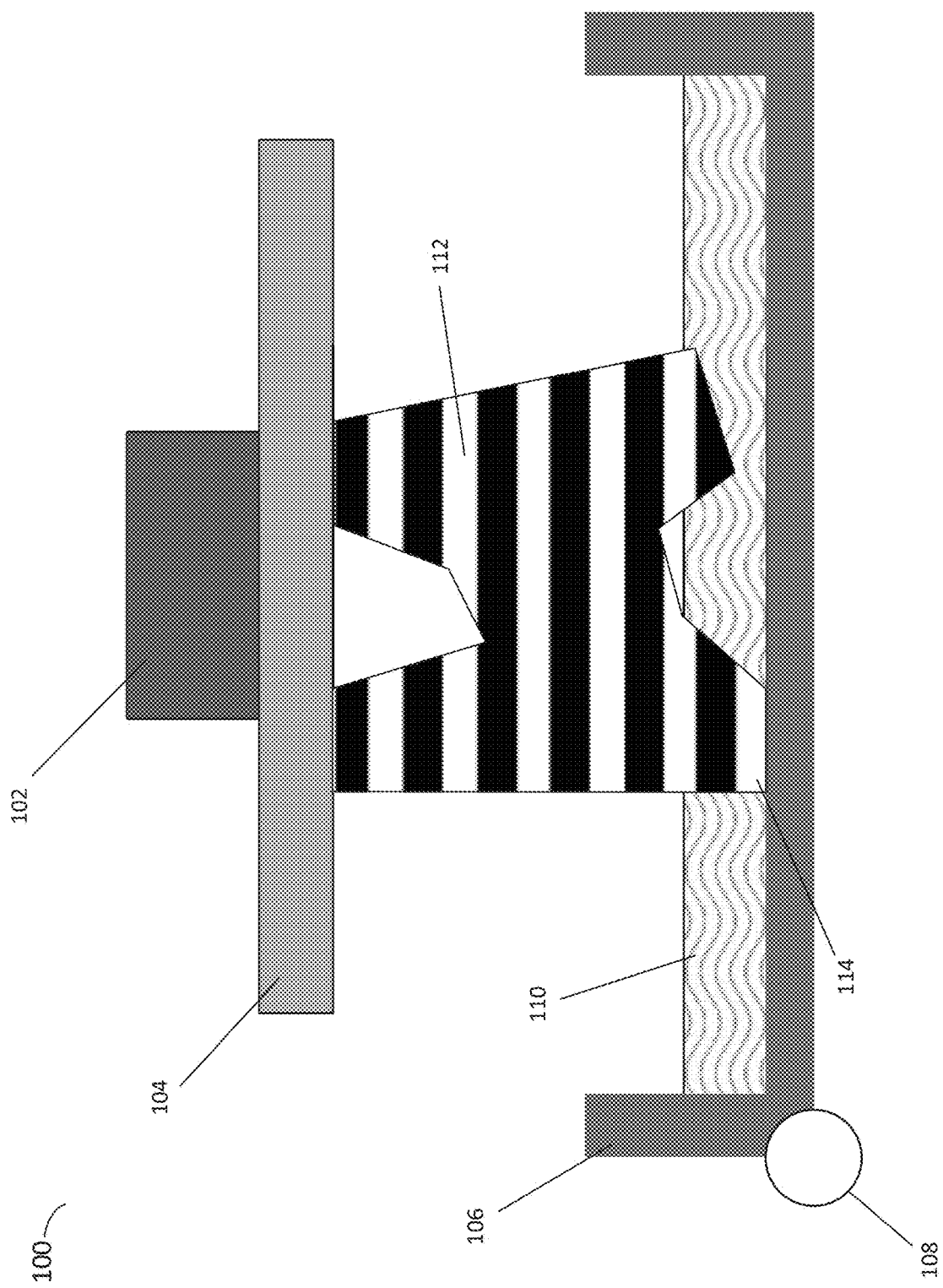

Techniques are provided for improving the surface finish and reducing differential cure artifacts in an object produced by additive fabrication, thereby increasing object fidelity. As discussed above, in additive fabrication, one or more layers may be formed either on a previously formed layer or on a substrate upon which an object is formed. According to some embodiments, these layers are formed when an area of liquid resin is exposed to an area of actinic radiation. The area of the liquid resin selected for curing within each layer corresponds to a cross-section of the object being fabricated. In some use cases, the area exposed to actinic radiation is smaller than the cross-section's area, and therefore must be moved to cover the full area of the cross-section. In some cases, the cross-section of the object contains encapsulated regions where material is not to be cured whilst being surrounded by areas in which material is to be cured. These regions are referred to herein as "voids," or "interior voids" and to form a cross-section including a void, the area of incident actinic radiation must be moved over the cross-section such that it cures the regions of the cross-section as intended whilst not substantially exposing the liquid resin within the area or areas of the void.

Conventional techniques for curing cross-sectional areas containing voids continuously produce solid material whilst avoiding the void areas. For instance, a stereolithographic device might maintain continuous actinic radiation exposure by moving the area of actinic radiation exposure such that it avoids the void areas, thereby producing solid material at locations other than the void areas. As another example, a fused deposition modeling device may continuously deposit material whilst avoiding the void areas. One issue with such an approach is that there is potential for material shrinkage and motion-control hysteresis to produce time dependency in the resulting object. Since areas of the cross section are solidified (e.g., by curing a photopolymer, by cooling of a deposited thermoplastic, etc.) at different points in time, artifacts may be produced at interfaces between material solidified at a first time and adjacent material solidified at a sufficiently later time. These artifacts may appear as edges or other visible discontinuities, thereby resulting in a fabricated part that exhibits a lower quality than desired.

The inventors have recognized and appreciated that an additive fabrication device may be configured to fabricate objects with fewer and/or less visible instances of the above-described time-dependent artifacts by configuring the device to move an area of incident actinic radiation over voids whilst simultaneously deactivating the source of actinic radiation. While moving the area of incident actinic radiation over void areas may result in a longer path traversed by the area during fabrication, and thereby may result in an increased fabrication time, such an approach ensures that adjacent solid regions are formed close together in time, thereby mitigating the types of visible artifacts described above. As referred to herein, an area of actinic radiation is an area to which an actinic radiation source is directed, irrespective of whether the source is activated or deactivated.

According to some embodiments, an actinic radiation source may include any suitable source of radiation such as, but not limited to, a laser or an array of Light Emitting Diodes (LEDs). In some embodiments, an array of LEDs may be arranged in an actinic radiation bar having a width equal to the width of a fabrication area. Points along the width of a fabrication area may be selectively illuminated, thereby forming solid material in those locations, and a layer of an object formed by successively moving this bar across the fabrication area.

According to some embodiments, an additive fabrication device may be configured to move an area of actinic radiation whilst the actinic radiation source is deactivated so as to reduce a difference in time between formation of adjacent regions of solid material. In some use cases, an area of actinic radiation may raster a cross section by traversing scan lines, and in some cases, two scan lines may be adjacent to one another yet have very different lengths. For devices in which the area of actinic radiation takes time to move, this may result in the amount of time taken for the actinic radiation to produce solid material in one scan line to substantially differ from the amount of time to produce solid material in an adjacent scan line, and this difference may cause visible artifacts in the resulting object. In some embodiments, scan lines may be extended by appending additional portions of the scan line during which the actinic radiation is deactivated. Thus, no additional material is fabricated yet the difference in duration for production of adjacent scan lines may be reduced sufficiently to mitigate the visible artifacts.

Following below are more detailed descriptions of various concepts related to, and embodiments of, techniques for improving the surface finish and reducing differential cure artifacts in an object produced by additive fabrication. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

To illustrate one exemplary additive fabrication technique, an inverse stereolithographic printer is depicted in FIGS. 1A-B. Exemplary stereolithographic printer 100 forms a part in a downward facing direction on a build platform such that layers of the part are formed in contact with a surface of a container in addition to a previously cured layer or the build platform. In the example of FIGS. 1A-B, stereolithographic printer 100 comprises build platform 104, container 106, axis 108 and liquid resin 110. A downward facing build platform 104 opposes the floor of container 106, which is filled with a liquid photopolymer 110. FIG. 1A represents a configuration of stereolithographic printer 100 prior to formation of any layers of a part on build platform 104.

As shown in FIG. 1B, a part 112 may be formed layerwise, with the initial layer attached to the build platform 104. The container's floor may be transparent to actinic radiation, which can be targeted at portions of the thin layer of liquid photocurable resin resting on the floor of the container. Exposure to actinic radiation cures a thin layer of the liquid resin, which causes it to harden. The layer 114 is at least partially in contact with both a previously formed layer and the surface of the container 106 when it is formed. The top side of the cured resin layer typically bonds to either the bottom surface of the build platform 4 or with the previously cured resin layer in addition to the transparent floor of the container. In order to form additional layers of the part subsequent to the formation of layer 114, any bonding that occurs between the transparent floor of the container and the layer must be broken. For example, one or more portions of the surface (or the entire surface) of layer 114 may adhere to the container such that the adhesion must be removed prior to formation of a subsequent layer.

Figure 2A:
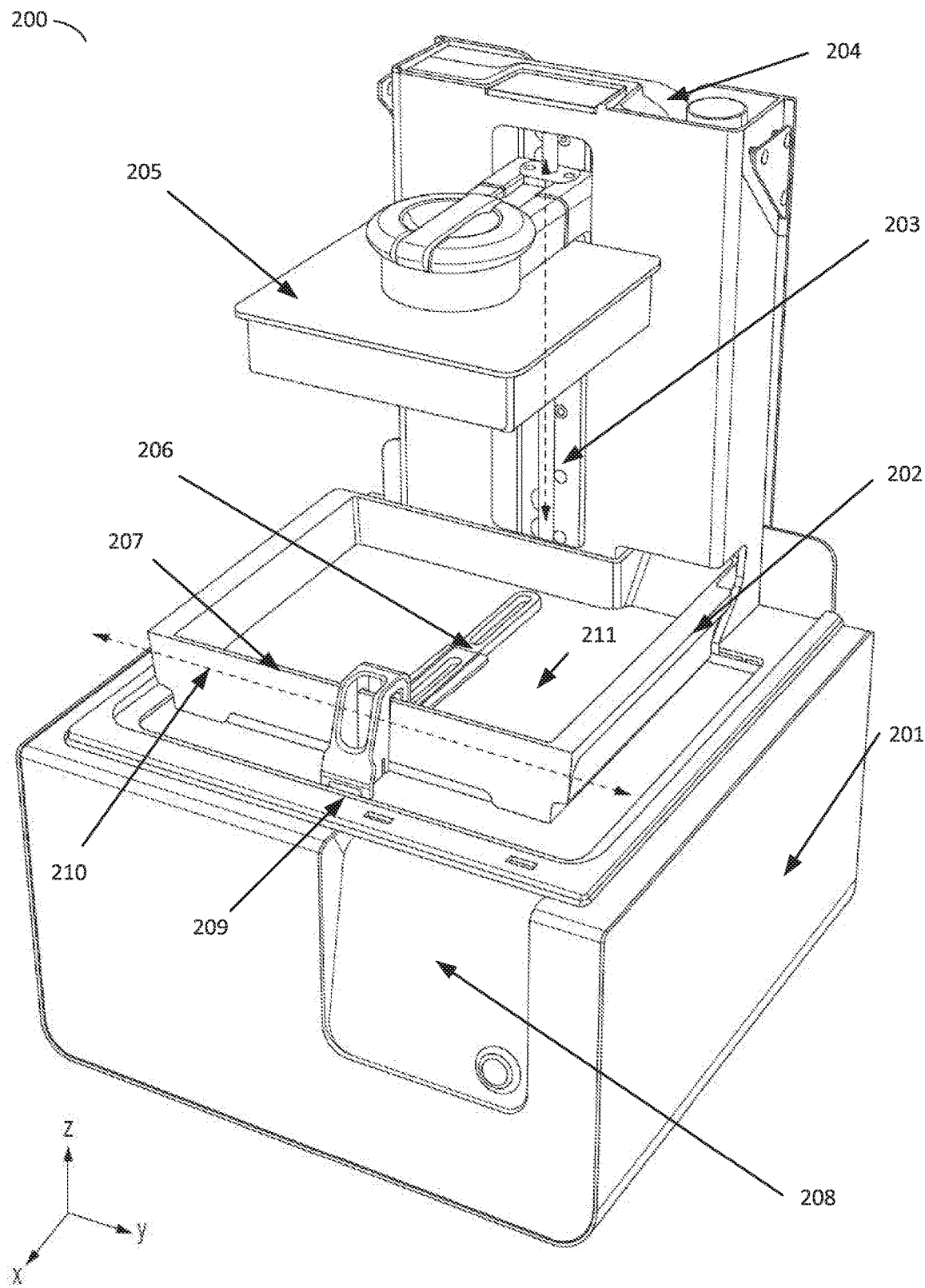
FIGS. 2A-B depict an illustrative stereolithographic printer, according to some embodiments.
Figure 2B:
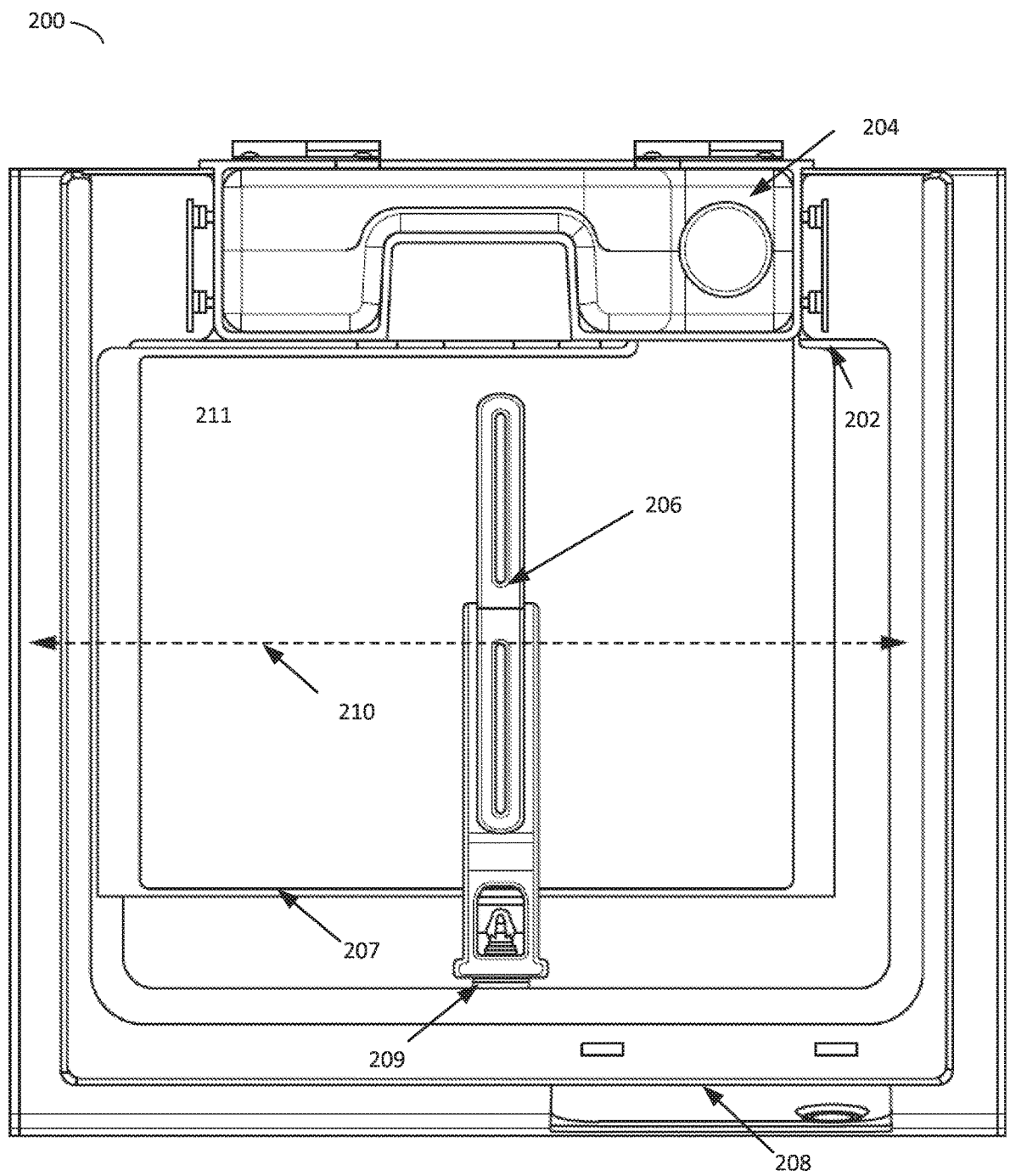

According to some embodiments, an illustrative additive fabrication system is depicted in FIGS. 2A-B. Illustrative stereolithographic printer 200 comprises a support base 201, a display and control panel 208, and a reservoir and dispensing system for photopolymer resin 204. The support base 201 may contain various mechanical, optical, electrical, and electronic components that may be operable to fabricate objects using the system. During operation, photopolymer resin may be dispensed from the dispensing system 204 into container 202. Build platform 205 may be positioned along the vertical axis 203 such that the bottom facing layer of an object being fabricated, or the bottom facing layer of build platform 205 itself, is a desired distance from the bottom 211 of container 202. The bottom 211 of the container 202 may be advantageously transparent to actinic radiation generated by a source located within the support base (not shown) such that liquid photopolymer resin located between the bottom 211 of container 202 and the bottom facing portion of build platform 205 or an object being fabricated thereon, may be exposed to the radiation. Upon exposure to such actinic radiation, the liquid photopolymer may undergo a chemical reaction, sometimes referred to as "curing," that substantially solidifies and attaches the exposed resin to the bottom facing portion of build platform 205 or to an object being fabricated thereon. (FIGS. 2A-B represent a configuration of stereolithographic printer 201 prior to formation of any layers of an object on build platform 205).

Figure 3A:
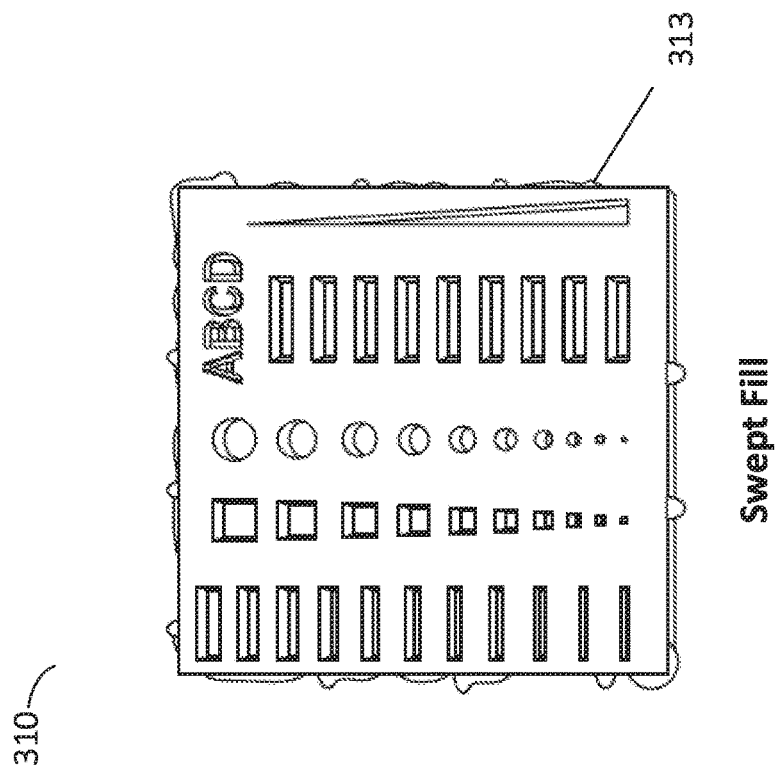
FIGS. 3A-B contrast illustrative surface finishes of an object formed using traditional applications of actinic radiation and the same object formed using the application of actinic radiation according to techniques described herein, according to some embodiments.
Figure 3B:
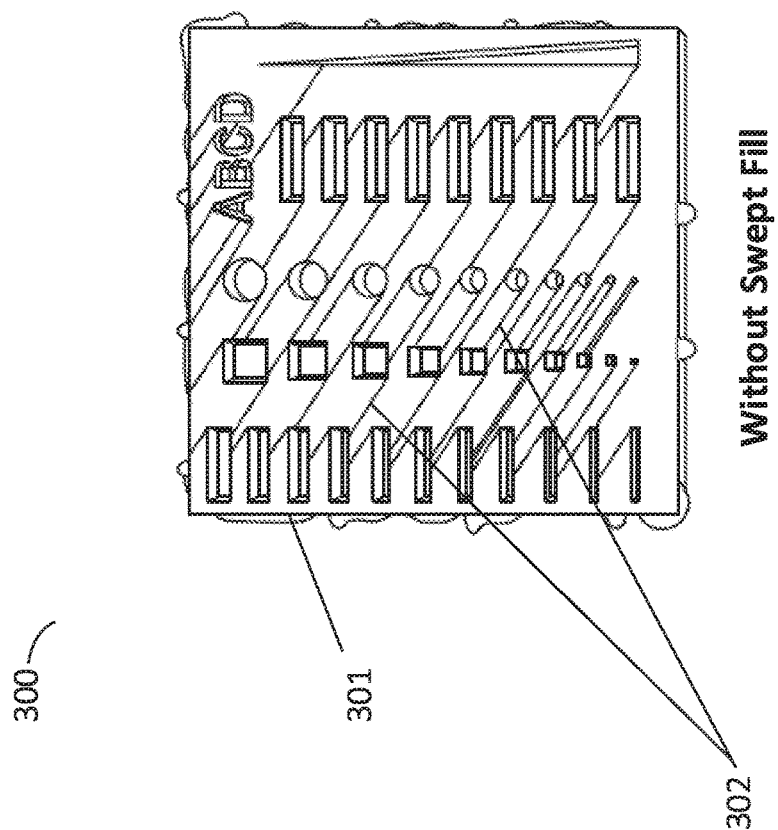

FIGS. 3A and 3B provides an illustrative visual overview of possible outcomes of using the exposure techniques described below and depicted in FIGS. 4A and 4B. The technique described and depicted by 4A results in object 301 ("without swept fill") while the technique described and depicted by 4B results in object 313 ("swept fill"). As is evident from FIG. 3A, the conventional approach produces artifacts such as artifacts 302 which appear as lines on the surface of the object 301. As discussed above, the conventional approach of maintaining continuous material production whilst avoiding voids may produce different regions of solid material that are in contact with one another yet are formed at different times. Differences in temperature, curing time, material type, cooling time, etc., depending on the particular additive fabrication technique being employed, may cause such artifacts to appear at the interfaces between such regions. In contrast, the object 313 produced via the swept fill technique described below, includes no such artifacts.

Figure 4A:
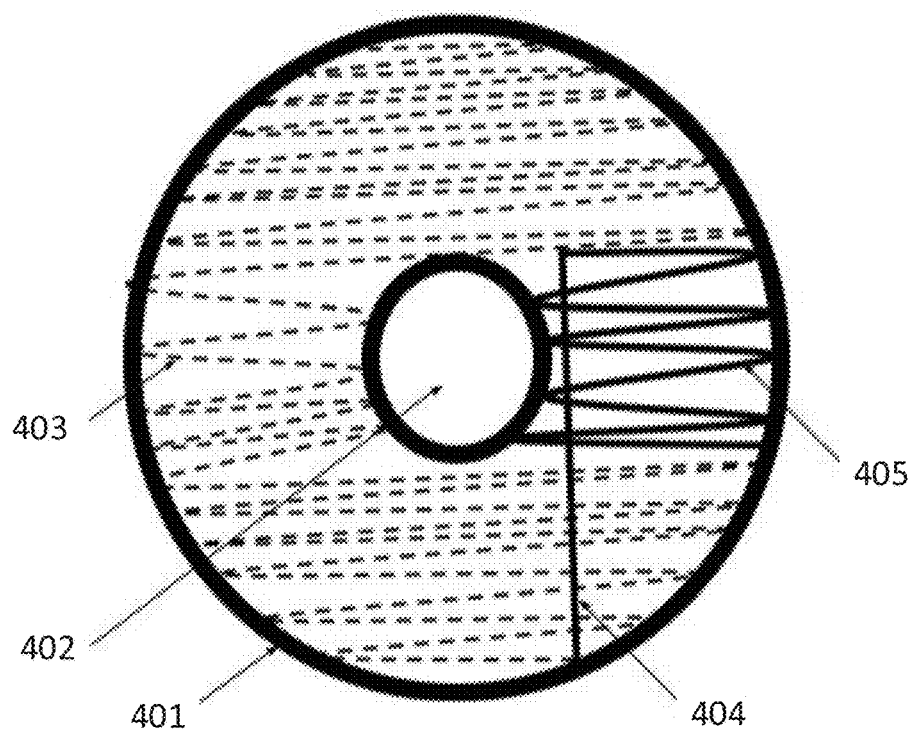
FIGS. 4A-B depict sample paths of incident actinic radiation over a cross-sectional area of an object, according to some embodiments.
Figure 4B:
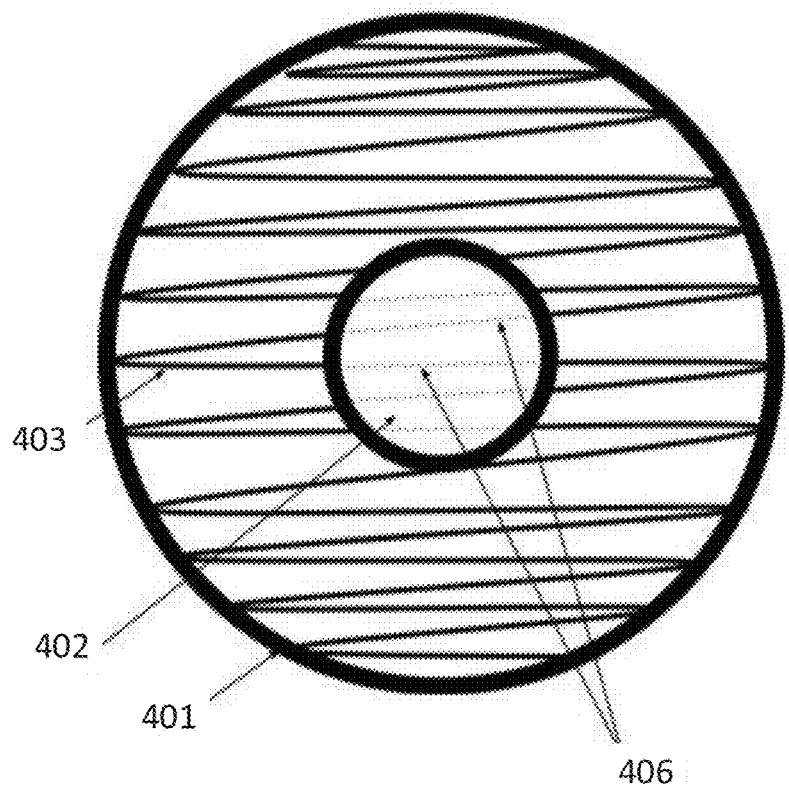

FIGS. 4A and 4B illustrate sample fill patterns corresponding to movements of the incident area of actinic radiation when producing a layer of an object. For the purposes of illustrating the swept fill technique, fabrication of an object via stereolithography will be described. However, it will be appreciated that the technique may be employed in other types of additive fabrication, such as fused deposition modeling, selective laser sintering, etc.

In the example of FIGS. 4A and 4B, the illustrated cross-sections may correspond to an object that could be, for example, a thick-walled tube oriented along the build axis with each layer having the shape of a hollow ring 401 or annulus. In each approach, an area of incident actinic radiation traces out the cross-section of the object in a series of substantially parallel paths 403 spaced apart by some distance. In some embodiments, that distance may be 100 µm, although the distance could also be more or less.

In the conventional approach depicted in FIG. 4A, to trace out an annulus 401, some paths of the incident actinic radiation run the full width through the "top" and "bottom" of the annulus, while other paths are broken by the void 402 in the middle. In the illustrated example of FIG. 4A, the incident actinic radiation starts at the top of the annulus and traces out a path from side to side, down the left side of the void 402, and to the bottom of the annulus. The path then moves up along path segment 404 to complete the annulus by tracing out the path segment 405 to the right of the void 402.

In some types of additive fabrication, it may take time to move the area of incident actinic radiation over the material to be cured. While the approach depicted in FIG. 4A may be a time-efficient approach to filling an area, this approach may also produce artifacts at interfaces between regions where the liquid resin was hardened or cured at different times. In the example of FIG. 4A, this visible difference could be apparent in the line 404 and/or a difference in properties between areas filled by path segment 403 and those filled by path segment 405, thereby producing a visual discontinuity between those areas. As discussed above, FIG. 3A shows some differential cure artifacts 302 as part of an object 301 utilizing the fill technique described and depicted by FIG. 4A.

FIG. 4B depicts an illustrative approach to reducing visible seams or other artifacts (e.g., artifacts 302) created by the fill technique described above in relation to FIG. 4A. In this "swept fill" approach, the area of incident actinic radiation is moved across all regions of the cross-section 401. The actinic radiation is activated over areas to be cured yet deactivated over areas not to be cured, including voids. Thus, rather than selecting a path that optimizes coverage of the cross section under an assumption that the radiation source is activated during this operation, the swept fill approach selects an efficient path over the whole cross section based on its outer edge, and avoids curing voids by turning off the radiation source when the radiation source is pointing at the void region(s).

In the example of FIG. 4B, this approach produces a serpentine pattern in which the annulus 401 is filled in whilst the actinic radiation is deactivated over void areas 402. The path of the source of actinic radiation would be continuous, with portions of the path where the source of radiation is directed on the path whilst turned off represented by dotted lines 406, and portions of the path where the source of radiation is directed on the path whilst turned on represented by the solid lines 403. In at least some cases, this approach may not be time-optimal, but it may also limit visible artifacts or discontinuities (e.g., artifacts 302) that would otherwise be produced due to time-dependent, differential cure properties of the liquid resin. This technique could be called a "swept fill" technique. The resulting smooth surface finish of this technique can be observed in FIG. 3 on the swept fill object 313.

The swept fill technique depicted in FIG. 4B may, in at least some use cases, cause the overall fabrication process to take longer. According to some embodiments, the swept fill technique of FIG. 4B may be applied only to those layers and/or only to portions of layers that are expected to be visible in the fabricated object. For ease of description, layers expected to be visible in a fabricated object are referred to below simply as "visible layers."

According to some embodiments, a visible layer may be defined as the surface facing layers or portions of layers. In another embodiment the visible layer could be defined as all layers within N layers of a surface facing layer or portion of layer. In some embodiments the number of layers or number of portions of layers N could be determined based on a variety of factors, such as the type of material used, whether the visible layer or portion is top or bottom facing, user input, or any suitable combination of these and/or other factors. A software application configured to analyze a three-dimensional object and produce instructions for an additive fabrication device may analyze the shape and surfaces of the object and determine which paths to produce in each layer so as to avoid artifacts in visible layers (or the N layers closest to the surface).

According to some embodiments, the swept fill technique may be employed in only a portion of a layer being fabricated. In each such portion (which may be a portion of a visible layer or a visible portion of a layer that is not expected to be fully visible) an additive fabrication device may move an area of incident actinic radiation using the swept fill technique, while a remainder of the layer may use a more time-optimal path to move the area of incident actinic radiation.

In some embodiments, visible layers and/or portions of layers may be further refined to avoid time-dependent cure artifacts. By way of example, visible layers or portions of layers may be rastered at a finer spacing of the path of incident actinic radiation. For example, for the visible regions the area of incident actinic radiation could be moved in substantially parallel lines less than 100 μm apart, while the remainder of the object could be formed by movement of the area of incident actinic radiation in substantially parallel lines 100 μm or further apart. Finer spacing during rastering may improve the layer finish for a smoother overall cross section. This smoother finish may enhance the overall surface finish for improved model aesthetic. The increased exposure may strengthen the cured or hardened layer and may also make the material less likely to warp.

The term raster as used herein encompasses directing an area of actinic radiation over a path made up of substantially parallel scanlines that may be linear or large enough to encompass the full cross-section of the area to be fabricated.

According to some embodiments, it may be advantageous to distinguish between top-facing and bottom-facing surfaces to further optimize the movement of the area of actinic radiation and time of fabrication. In such cases while it may be advantageous to have a better surface finish on top-facing visible layers, it may be desirable to use faster rastering techniques that may leave time-dependent cure artifacts on bottom facing surfaces. Alternatively where surface finish is not a concern, but rather adherence to the build plate, it may be advantageous to implement finer spaced rastering to increase the exposure to actinic radiation and thereby the material adherence to the build platform.

In some embodiments, it may be advantageous to further optimize the movement of the area of incident actinic radiation by combining the movement for regions designated for the swept fill technique but adjacent to portions of the cross section that are not designated as visible or within N layers of visible layers. In this embodiment, the goal would be to maintain the movement of the area of incident actinic radiation for as much of the layer including the portion of visible layer as possible in an effort to reduce total time and movement of the area of incident actinic radiation.

In some embodiments, the lengths of path segments traversed by an area of incident actinic radiation within a layer may vary substantially within the same layer. In FIG. 4B, for example, the straight path segments traversed at the top and bottom of the circular cross-sectional area are significantly shorter than the straight path segments are within the middle of the layer (notwithstanding that the source of actinic radiation is turned off for parts of these path segments). Because artifacts are caused by time-dependent cure properties such as hysteresis or shrinkage, it may be advantageous to introduce a delay in movement of actinic radiation (or scanline) such that each substantially parallel scanline is achieved in a substantially consistent time period. As such, according to some embodiments, for each scanline, an initial maximum path segment time may be determined by, subsequent to identifying a path for a source of actinic radiation, identifying a path segment spanning the cross-sectional area that is the longest of the path. For adjacent path segments that each span the cross-sectional area being fabricated, an additive fabrication device may be configured to traverse these path segments in the same amount of time. Adjusting the amount of time taken to traverse a path segment may include reducing the speed of the area of incident radiation and/or introducing pauses into the path during which the area of incident radiation does not move.

According to some embodiments, formation of a layer of material comprises a movement of the area of incident actinic radiation over perimeters of the cross-sectional area, which may include outer edges as well as perimeters of any voids in the cross-sectional area. While producing perimeters in this manner may produce smoother vertical object surfaces, such an approach may also create a differential time-curing artifact as observed above which, along with exposure and other factors, may produce a "lip" artifact at the edges of the perimeter and of the voided areas. In some embodiments, where a fabricated perimeter may be visible, fabrication of the perimeter may be omitted so that fabrication of a visible layer includes only movements of incident actinic radiation within the interior of the cross-sectional area. As a result, the visible layers or regions may have no or limited perimeter lip with the internal movements of the area of incident actinic radiation traversing the full cross-sectional area of the object. According to some embodiments, a perimeter may be eliminated for the entirety of areas determined to be in a visible region where the region is the visible layer or portion of a layer and any layer or portion within N layers. In some embodiments, fabrication of a perimeter may be omitted for some subsection of the N layers. For example, fabrication of a perimeter may be omitted only for a visible layer. Alternatively, fabrication of a perimeter may be omitted for any number of layers n within the visible region where n is less than N.

Figure 5:
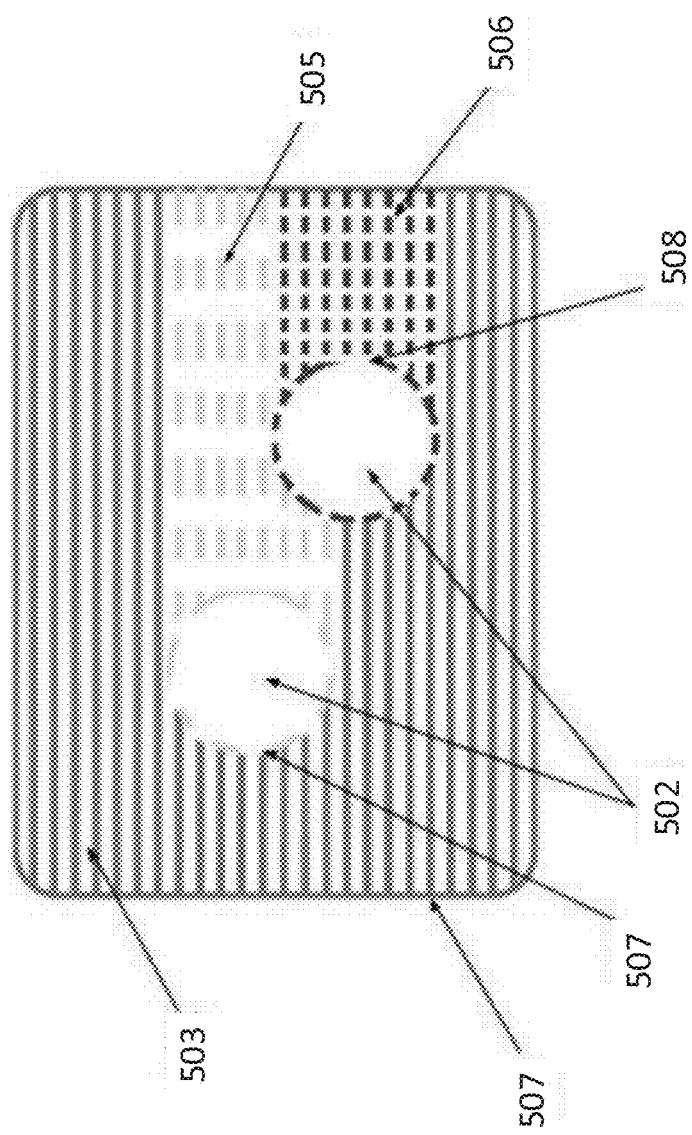
FIG. 5 depicts a sample path of incident actinic radiation over a cross-sectional area of an object where the object includes multiple voids, according to some embodiments.

Another example of the conventional fill technique applied in FIG. 4A in a case with multiple void areas 502 is depicted in FIG. 5. In this case, the area of incident actinic radiation is moved in substantially parallel paths 503 running the full length of the object, but only covering the lead side 507 of the two voids. The area of incident actinic radiation is then moved to target the following side of the first void 505, before continuing on to cover the following side of a subsequent void 506. This process might continue for all subsequent voids. The initial pass of the area of incident actinic radiation could fill in the lead side 507 of the cross-section with the following side 508 being filled in with one or more subsequent passes. Each of these subsequent passes might leave cure artifacts (e.g. akin to cure artifacts 302) based on the time dependent cure qualities of the material.

Figure 6:
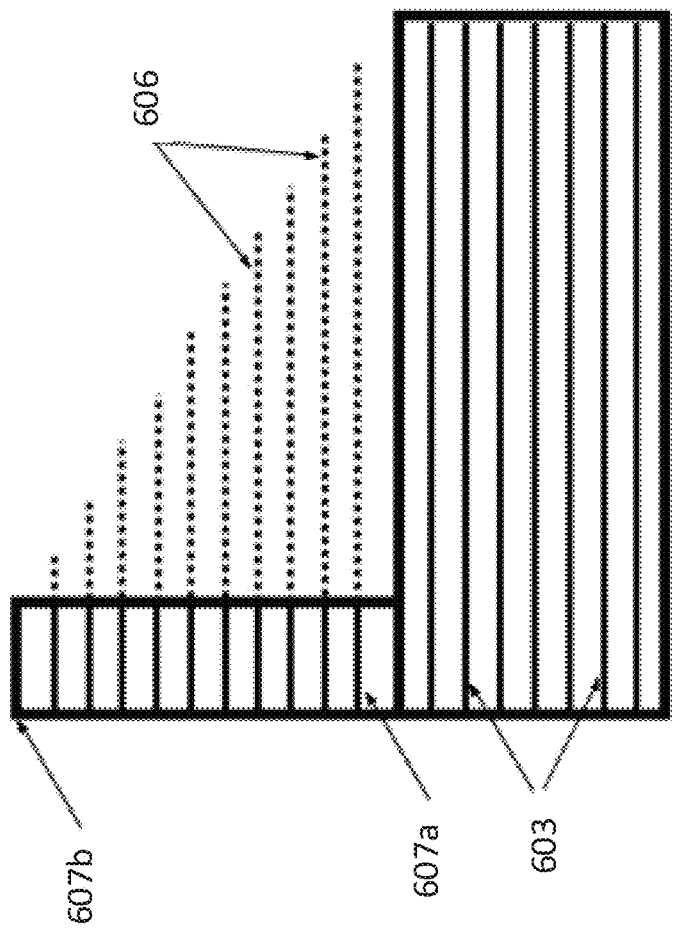
FIG. 6 depicts a sample path of incident actinic radiation over a cross-sectional area of an object with a high delta between scanlines, according to some embodiments.

FIG. 6 is illustrative of a cross-sectional area for which deactivated movement or delay in movement, as described above, may be performed to control time-dependent cure artifacts. In the example of FIG. 6, the path illustrated by adjacent horizontal sections is traversed from the bottom of the figure to the top of the figure. For illustrative path segments 603, the area of actinic radiation may be on or active so that solid material is formed along these path segments. The duration of movement of the area of actinic radiation may be the same for each of these path segments or "scanlines," which are the same length.

As the geometry of the shape changes in the illustrative cross-section of FIG. 6, however, the length of the path segments 607a and 607b differ from that of path segments 603. As a result, the area of actinic radiation would ordinarily move across the illustrated cross-section more quickly for path segments 607a and 607b than for path segments 603. As discussed above, differences in durations over which the area of actinic radiation traverses adjacent path segments spanning the cross-section may result in visible artifacts in the fabricated material. In the example of FIG. 6, such artifacts may be mitigated by continuing the motion of the area of actinic radiation such that the path segments 607a and 607b are extended by path segments 606. The source of actinic radiation may be shut off when the area traverses path segments 606 so as not to form material in those locations. Note that, in the example of FIG. 6, the segments 606 are progressively shorter as the path proceeds to minimize the length of the path whilst also reducing differences in the lengths of adjacent path segments.

As can be seen in the example of FIG. 6, the length of the path segments 606 is systematically reduced between scanline 607a and 607b whilst the length of path segments during which the source of actinic radiation is activated does not change between 607a and 607b. If the difference in the length of adjacent path segments 606 is constant, the length of the path segments 606 during which the source of actinic radiation is deactivated would be reduced in a linear fashion such that, by a sufficient distance from the initially traversed path segment 606, an activated path segment would no longer require a corresponding deactivated path segment. In the example of FIG. 6, such a path segment is shown as 607b where the area of actinic radiation does not continue to move in a deactivated scanline 606. Determining the maximum change in scanline duration may depend on the material properties and propensity of such for time-dependent cure artifacts. It may also depend on a variety of user selected inputs such as optimal surface finish or optimal time requirements. Adjusting the amount of time taken to traverse a path segment may further include reducing the speed of the area of incident radiation and/or introducing pauses into the path during which the area of incident radiation does not move.

Figure 7:
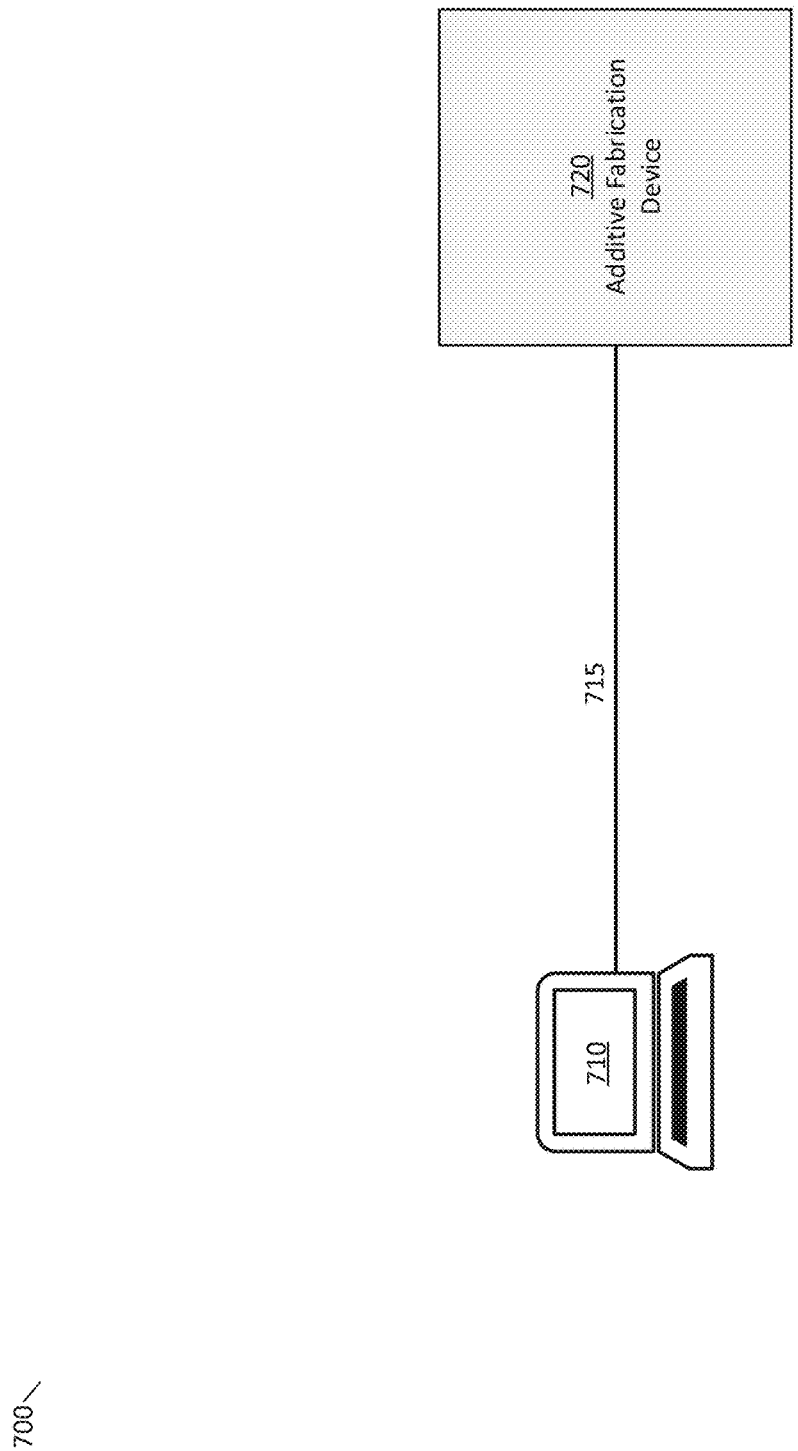
FIG. 7 is a block diagram of a system suitable for practicing aspects of the invention, according to some embodiments.

FIG. 7 is a block diagram of a system suitable for practicing aspects of the invention, according to some embodiments. As described above, an additive fabrication device may be configured to fabricate solid material along a path that applies the swept fill technique, thereby improving print quality. System 700 illustrates a system suitable for configuring an additive fabrication device to fabricate solid material in this manner. According to some embodiments, computer system 710 may execute software that determines a plurality of two-dimensional layers of a three-dimensional model of an object (sometimes referred to as "slicing"). As a result, data is produced describing two-dimensional layers that may each comprise cross-sections of the object. Paths for traversing these cross-sections utilizing the swept fill techniques described above may be generated. Instructions may then be generated from these paths to be provided to an additive fabrication device, such as additive fabrication device 720, that, when executed by the device, fabricates the layers according to the generated paths and thereby fabricates the object. Such instructions may be communicated via link 715, which may comprise any suitable wired and/or wireless communications connection. In some embodiments, a single housing holds the computing device 710 and additive fabrication device 720 such that the link 715 is an internal link connecting two modules within the housing of system 700.

Figure 8:
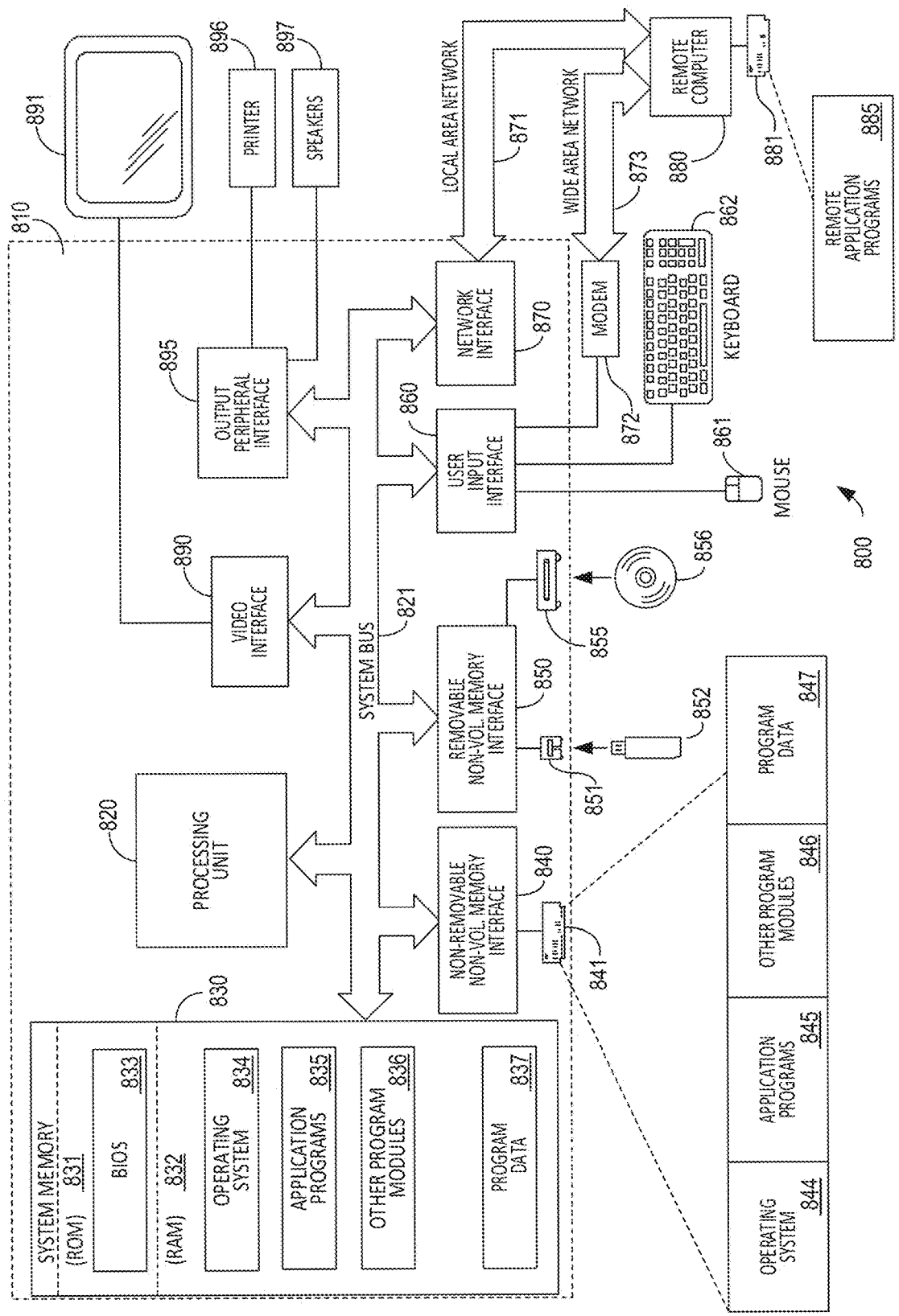
FIG. 8 illustrates an example of a computing system environment on which aspects of the invention may be implemented.

FIG. 8 illustrates an example of a suitable computing system environment 800 on which the technology described herein may be implemented. For example, computing environment 800 may form some or all of the computer system 710 shown in FIG. 7. The computing system environment 800 is only one example of a suitable computing environment and is not intended to suggest any limitation as to the scope of use or functionality of the technology described herein. Neither should the computing environment 800 be interpreted as having any dependency or requirement relating to any one or combination of components illustrated in the exemplary operating environment 800.

The technology described herein is operational with numerous other general purpose or special purpose computing system environments or configurations. Examples of well-known computing systems, environments, and/or configurations that may be suitable for use with the technology described herein include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The technology described herein may also be practiced in distributed computing environments where tasks are performed by remote processing devices that are linked through a communications network. In a distributed computing environment, program modules may be located in both local and remote computer storage media including memory storage devices.

With reference to FIG. 8, an exemplary system for implementing the technology described herein includes a general purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 810 typically includes a variety of computer readable media. Computer readable media can be any available media that can be accessed by computer 810 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 810. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, application programs 835, other program modules 836, and program data 837.

The computer 810 may also include other removable/non-removable, volatile/nonvolatile computer storage media. By way of example only, FIG. 8 illustrates a hard disk drive 841 that reads from or writes to non-removable, nonvolatile magnetic media, a flash drive 851 that reads from or writes to a removable, nonvolatile memory 852 such as flash memory, and an optical disk drive 855 that reads from or writes to a removable, nonvolatile optical disk 856 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through a non-removable memory interface such as interface 840, and magnetic disk drive 851 and optical disk drive 855 are typically connected to the system bus 821 by a removable memory interface, such as interface 850.

The drives and their associated computer storage media discussed above and illustrated in FIG. 8, provide storage of computer readable instructions, data structures, program modules and other data for the computer 810. In FIG. 8, for example, hard disk drive 841 is illustrated as storing operating system 844, application programs 845, other program modules 846, and program data 847. Note that these components can either be the same as or different from operating system 834, application programs 835, other program modules 836, and program data 837. Operating system 844, application programs 845, other program modules 846, and program data 847 are given different numbers here to illustrate that, at a minimum, they are different copies. A user may enter commands and information into the computer 810 through input devices such as a keyboard 862 and pointing device 861, commonly referred to as a mouse, trackball or touch pad. Other input devices (not shown) may include a microphone, joystick, game pad, satellite dish, scanner, or the like. These and other input devices are often connected to the processing unit 820 through a user input interface 860 that is coupled to the system bus, but may be connected by other interface and bus structures, such as a parallel port, game port or a universal serial bus (USB). A monitor 891 or other type of display device is also connected to the system bus 821 via an interface, such as a video interface 890. In addition to the monitor, computers may also include other peripheral output devices such as speakers 897 and printer 896, which may be connected through an output peripheral interface 895.

The computer 810 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 810, although only a memory storage device 881 has been illustrated in FIG. 8. The logical connections depicted in FIG. 8 include a local area network (LAN) 871 and a wide area network (WAN) 873, but may also include other networks. Such networking environments are commonplace in offices, enterprise-wide computer networks, intranets and the Internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. The modem 872, which may be internal or external, may be connected to the system bus 821 via the user input interface 860, or other appropriate mechanism. In a networked environment, program modules depicted relative to the computer 810, or portions thereof, may be stored in the remote memory storage device. By way of example, and not limitation, FIG. 8 illustrates remote application programs 885 as residing on memory device 881. It will be appreciated that the network connections shown are exemplary and other means of establishing a communications link between the computers may be used.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. However, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a non-transitory computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software," when used herein, are used in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of configuring an additive fabrication device to fabricate an object, the additive fabrication device configured to form solid material by directing at least one source of actinic radiation onto a liquid photopolymer, the method comprising:
   evaluating a first cross-section of a three-dimensional model of the object to determine whether or not a first layer of the object to be formed based on the first cross-section will be visible as a surface layer upon fabrication;
   evaluating a second cross-section of the three-dimensional model of the object to determine whether or not a second layer of the object to be formed based on the second cross-section will be visible as a surface layer upon fabrication;
   generating, in response to determining that the first layer of the object will be visible as a surface layer upon fabrication, a first path over which the at least one source of actinic radiation is to be directed to form the first layer of the object, wherein the first path includes a first portion over which the at least one source of actinic radiation is to be activated within the first cross-section to form the first layer, and a second portion over which the at least one source of actinic radiation is to be deactivated that lies outside of the first cross-section;
   generating, in response to determining that the second layer of the object will not be visible as a surface layer upon fabrication, a second path over which the at least one source of actinic radiation is to be directed to form the second layer of the object, wherein the second path includes a first portion, which is connected to a second portion of the second path, the second portion of the second path being connected to a third portion of the second path, wherein the third portion of the second path is located at least partially between the first portion of the second path and the second portion of the second path; and
   generating, using at least one processor, instructions that, when executed by the additive fabrication device, cause the additive fabrication device to fabricate the object at least in part by directing the at least one source of actinic radiation over the first path, including activating and deactivating the at least one source of actinic radiation over the first path, and at least in part by directing the at least one source of actinic radiation over the second path, including continuously activating the at least one source of actinic radiation over the second path.

2. The method of claim 1, wherein the second portion of the first path is generated based on a measure of time-dependent cure artifacts expected to be produced if the first path did not include the second portion of the first path.

3. The method of claim 1, wherein the second portion of the first path traverses an interior void within the first cross-section of the three-dimensional model of the object.

4. The method of claim 1, wherein the first path further includes a third portion of the first path over which the at least one source of actinic radiation is to be deactivated, wherein the third portion of the first path is arranged parallel to and adjacent to the second portion of the first path, and wherein a length of the third portion of the first path is determined based at least in part on a length of the second portion of the first path.

5. The method of claim 1, wherein the first path further includes at least one point at which the at least one source of actinic radiation is to be stationary for a period of time while the at least one source of actinic radiation is deactivated.

6. The method of claim 1, wherein the third portion of the second path overlaps the first portion of the second path and/or the second portion of the second path.

7. The method of claim 1, wherein the third portion of the second path is adjacent to an internal void of the second cross-section of the three-dimensional model of the object.

8. The method of claim 1, wherein the third portion of the second path is adjacent to an external edge of the second cross-section of the three-dimensional model of the object.

9. The method of claim 1, wherein evaluating the first cross-section of the three-dimensional model to determine whether or not the first layer of the object will be visible as a surface layer upon fabrication comprises determining whether or not the first layer is wholly within a threshold number of layers next to the object's surface.

10. The method of claim 1, wherein evaluating the first cross-section of the three-dimensional model of the object to determine whether or not the first layer of the object will be visible as a surface layer upon fabrication comprises determining whether or not the first layer is wholly at the object's surface.

11. The method of claim 1, wherein evaluating the second cross-section of the three-dimensional model of the object to determine whether or not the second layer of the object will be visible as a surface layer upon fabrication comprises determining whether or not the second layer is wholly at the object's surface.

\* \* \* \* \*